United States Patent
Fujishiro

(10) Patent No.: US 8,750,067 B2
(45) Date of Patent: Jun. 10, 2014

(54) SEMICONDUCTOR DEVICE HAVING RESET FUNCTION

(76) Inventor: Keisuke Fujishiro, Chuo-ku (JP)

(*) Notice: Subject to any disclaimer, the term of this patent is extended or adjusted under 35 U.S.C. 154(b) by 128 days.

(21) Appl. No.: 13/287,600

(22) Filed: Nov. 2, 2011

(65) Prior Publication Data

US 2012/0127817 A1    May 24, 2012

(30) Foreign Application Priority Data

Nov. 18, 2010 (JP) ................. 2010-257630
Aug. 1, 2011 (JP) ................. 2011-168083

(51) Int. Cl.
*G11C 7/00* (2006.01)

(52) U.S. Cl.
USPC ....................... 365/222; 365/233.1

(58) Field of Classification Search
USPC .................. 365/222, 233.1, 236
See application file for complete search history.

(56) References Cited

U.S. PATENT DOCUMENTS

| 7,668,032 B2* | 2/2010 | Kim et al. ............... 365/222 |
| 7,701,790 B2 | 4/2010 | Do et al. |
| 7,986,581 B2 | 7/2011 | Do et al. |
| 2006/0007770 A1* | 1/2006 | Shinozaki et al. ....... 365/222 |
| 2007/0070727 A1 | 3/2007 | Do et al. |
| 2010/0149891 A1 | 6/2010 | Do et al. |

FOREIGN PATENT DOCUMENTS

JP        2007-095278 A    4/2007

* cited by examiner

*Primary Examiner* — Huan Hoang
(74) *Attorney, Agent, or Firm* — Sughrue Mion, PLLC

(57) ABSTRACT

A semiconductor device comprises a memory cell array, a row control circuit for controlling an access to the memory cell array, and a refresh control circuit for instructing the row control circuit to refresh the memory cell array. After temporarily transiting to a reset state due to an activation of a reset signal, the refresh control circuit instructs to refresh the memory cell array in response to a transition to an initial state due to a de-activation of the reset signal.

15 Claims, 9 Drawing Sheets

SEMICONDUCTOR DEVICE HAVING RESET FUNCTION

BACKGROUND OF THE INVENTION

1. Field of the Invention

The present invention relates to a semiconductor device, and particularly to a semiconductor device having a reset function.

2. Description of Related Art

Some semiconductor devices such as DRAM (Dynamic Random Access Memory) performs a reset operation of an internal circuit thereof when a reset signal is activated. For example, when a power supply is turned on from the outside, a power-on reset signal is generated by a power-on reset circuit, so that each internal circuit inside a semiconductor device is reset. Each internal circuit is initialized by the reset operation thereby the semiconductor device typically enters an operable state.

The reset signal includes an external reset signal in addition to the power-on reset signal. The external reset signal is issued when the system needs to be initialized. When the external reset signal is activated, the semiconductor device is forcibly reset.

When receiving the reset signal, the semiconductor device such as DDR3 (Double Data Rate 3) type SDRAM (Synchronous Dynamic Random Access Memory) first transits to a "reset state" to stabilize an internal voltage. After a predetermined time (which will be called "reset time" below) has elapsed, the semiconductor device transits to an "initial state" to be initialized (see Japanese Patent Application Laid-Open No. 2007-95278).

In the reset state, the semiconductor device increases or reduces an external voltage thereby to generate the internal voltage having a predetermined designed value.

However, the inventor recognized that the internal voltage may become higher than the designed value at the transition to the initial state. If the internal voltage remains higher than the designed value, the initialization processing cannot be properly performed.

SUMMARY

In one embodiment, there is provided a semiconductor device that includes: a memory cell array; an access control circuit accessing the memory cell array; and a refresh control circuit controlling the access control circuit so that the access control circuit performs a refresh operation on the memory cell array when the semiconductor device transits from a reset state to an initial state.

In another embodiment, there is provided a semiconductor device that includes: a memory cell array; a first control circuit that resets the memory cell array during a reset signal being in a first logic level and issues a refresh signal a plurality of times in response to a transition of the reset signal from the first logic level to a second logic level; and a second control circuit that performs a refresh operation on the memory cell array in response to each issuance of the refresh signal.

In still another embodiment, there is provided a semiconductor device that includes: a memory cell array; a control circuit keeping the memory cell array in a reset state during a first period of time, releasing the memory cell array from the reset state thereof to an initial state thereof and keeping the memory cell array in the initial state during a second period of time following the first period of time, the control circuit performing a refresh operation on the memory cell array during the second period of time without receiving a refresh request from outside of the device.

BRIEF DESCRIPTION OF THE DRAWINGS

The above and the other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
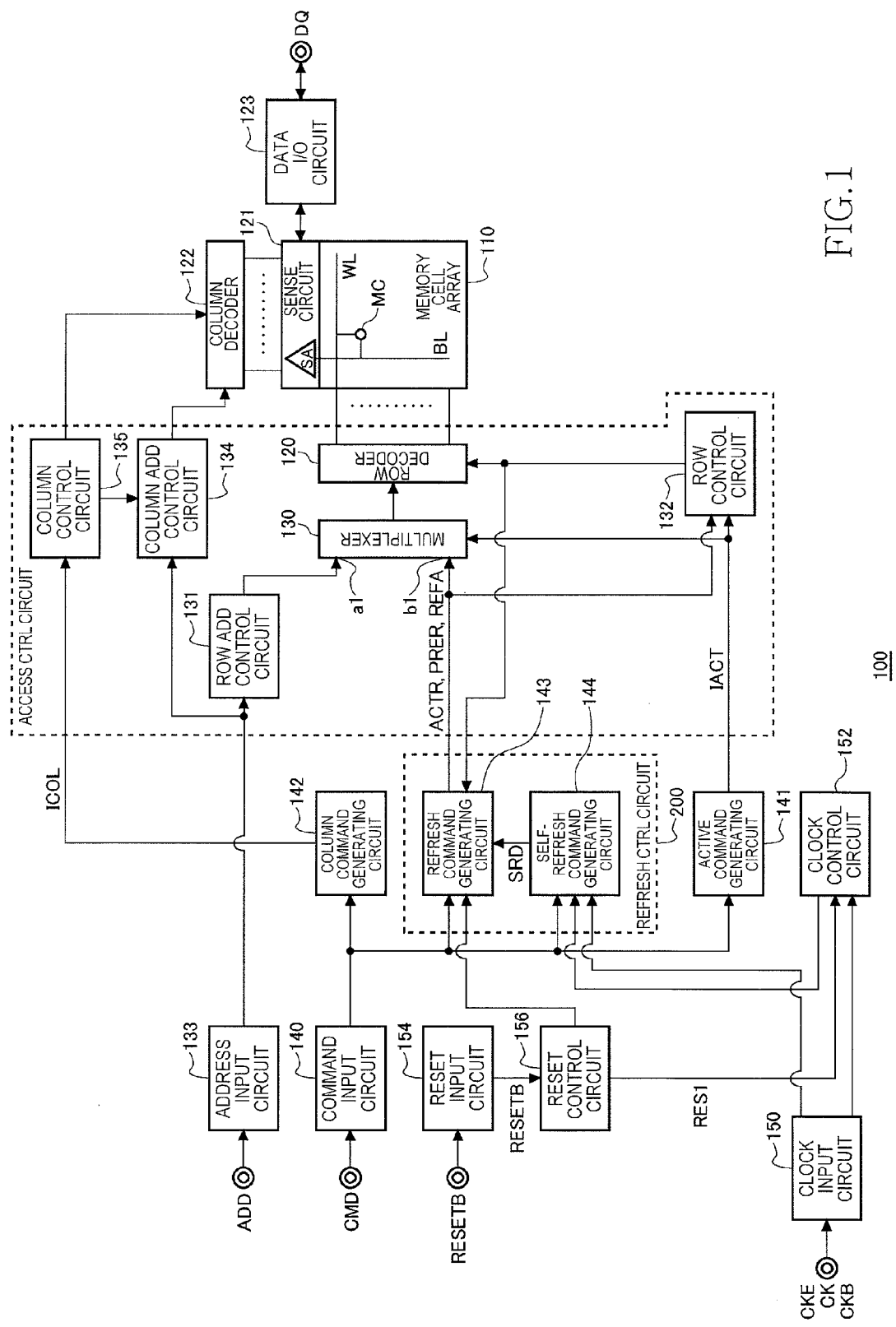
FIG. 1 is a functional block diagram indicative of an embodiment of a semiconductor device.

Referring now to FIG. 1, a semiconductor device 100 includes a memory cell array 110 including a plurality of memory cells MC. In the memory cell array 110, a plurality of word lines WL and a plurality of bit lines BL are intersected with each other and the memory cell MC is arranged on each intersection. FIG. 1 illustrates only one memory cell MC arranged on the intersection of one word line WL and one bit line BL.

The word line WL is selected by a row decoder 120. The bit line BL is connected to a corresponding sense amplifier SA included in a sense circuit 121 respectively. The sense amplifier SA selected by a column decoder 122 is connected to a data I/O circuit 123. The data I/O circuit 123 is connected to a data I/O terminal DQ to output read data from the memory cell array 110 via the data I/O terminal DQ to the outside during the read operation and to supply write data supplied to the data I/O terminal DQ from the outside to the memory cell array 110 during the write operation.

A row address supplied to the row decoder 120 is supplied from a row address control circuit 131 via a multiplexer 130. The row decoder 120 is controlled by a row control circuit 132. The row address control circuit 131 is supplied with a row address among the external addresses supplied to an address input circuit 133 via an address terminal ADD. When the command supplied to a command input circuit 140 via a command terminal CMD indicates an active command ACT, an active command generating circuit 141 activates an active command IACT and supplies it to the row control circuit 132. The active command IACT is also supplied to the multiplexer 130. When the active command IACT is activated, the multiplexer 130 selects an input node a1. Thereby, when the active command ACT and the row address are supplied from the outside, the row decoder 120 activates the word line WL indicated by the row address supplied from the outside. When the word line WL is activated, information in all the memory cells selected by the word line WL is read and amplified by the sense amplifier SA.

A column address supplied to the column decoder 122 is supplied from a column address control circuit 134. The operation of the column decoder 122 is controlled by a column control circuit 135. The column address control circuit 134 is supplied with a column address among the external addresses supplied to the address input circuit 133 via the address terminal ADD. When the command supplied to the command input circuit 140 via the command terminal CMD indicates a column command (read command or write command), a column command generating circuit 142 activates a read/write command ICOL and supplies it to the column control circuit 135. Thereby, when the column command and the column address are supplied from the outside, the column decoder 122 selects the sense amplifier SA indicated by the column address externally supplied. Consequently, the read data amplified by the selected sense amplifier SA is output to the data I/O circuit 123 during the read operation and the information on the selected sense amplifier SA is overwritten with the write data supplied from the data I/O circuit 123 during the write operation.

The access control circuit according to the present embodiment includes the column address control circuit 134, the column control circuit 135, the row address control circuit 131, the multiplexer 130, the row decoder 120, and the row control circuit 132.

The commands to be supplied to the command terminal CMD include various commands such as an auto-refresh command REF, a self-refresh entry command SRE, and a self-refresh exit command SRX in addition to the active command and the column command.

In the semiconductor device 100 such as DRAM, each word line WL is periodically activated in order to stably hold the data in the memory cells MC. This operation is called "refresh operation." The refresh operation includes two kinds: auto-refresh and self-refresh.

The auto-refresh is performed when the auto-refresh command REF is issued to the command terminal CMD. Typically, memory cells connected to a predetermined number of word lines WL are sequentially refreshed each time the auto-refresh command REF is issued. The auto-refresh command REF is periodically issued, so that the memory cell array 110 is periodically refreshed. During the normal operation of the semiconductor device 100, the semiconductor device 100 is refreshed by the auto-refresh.

The self-refresh is performed when the self-refresh entry command SRE is issued to the command terminal CMD. Typically, once the self-refresh entry command SRE is issued, a self-refresh command generating circuit 144 starts to periodically refresh memory cells connected to each word line WL. This is because the self-refresh command generating circuit 144 includes an oscillator. The self-refresh operation is continued until the self-refresh exit command SRX is issued. The semiconductor device 100 is refreshed by the self-refresh in a sleep state.

A refresh control circuit 200 according to the present embodiment includes a refresh command generating circuit 143 and the self-refresh command generating circuit 144. The auto-refresh is controlled by the refresh command generating circuit 143 and the self-refresh is controlled by the self-refresh command generating circuit 144 and the refresh command generating circuit 143.

When the auto-refresh command REF is issued, the refresh command generating circuit 143 activates a refresh command ACTR. When the refresh command ACTR is activated, a refresh address REFA is updated and is supplied together with the refresh command ACTR to the multiplexer 130. While the refresh command ACTR is being activated, the multiplexer 130 selects an input node b1. The refresh address REFA is supplied to the row decoder 120 and the word line WL indicated by the refresh address REFA is activated. When the word line WL is activated, the information in all the memory cells selected by the word line WL is read and amplified by the sense amplifier SA. The refresh command ACTR is also supplied to the row control circuit 132 and the row decoder 120 is activated by the row control circuit 132. When a predetermined time has elapsed from the activation of the refresh command ACTR, a PRER signal is activated and the row decoder 120 is inactivated by the row control circuit 132.

When the self-refresh entry command SRE is issued, the self-refresh command generating circuit 144 is activated. The self-refresh command generating circuit 144 activates a self-refresh signal SRD (self-refresh request signal) at a predetermined cycle asynchronous with the outside. The self-refresh signal SRD is supplied to the refresh command generating circuit 143 and thereby the refresh is performed like when the auto-refresh command REF is issued. When the self-refresh exit command SRX is issued, the self-refresh command generating circuit 144 is inactivated and the self-refresh signal SRD is stopped to be issued.

The "self-refresh signal SRD" and the "refresh command ACTR" are collectively called "refresh signal."

A clock input circuit 150 is supplied with a clock enable signal CKE and clock signals CK, CKB. When enabling the clock signal CK, the clock enable signal CKE is activated to a high level. The clock signal CK and the clock signal CKB are complementary to each other. The clock input circuit 150 supplies the clock enable signal CKE and the clock signals CK and CKB to the self-refresh command generating circuit 144 and a clock control circuit 152. The clock control circuit 152 controls the supply of the clock enable signal CKE to the self-refresh command generating circuit 144. Its details will be described below with reference to FIG. 2.

A reset input circuit 154 is supplied with a reset signal RESETB. The reset signal RESETB is activated to a low level during the reset and is inactivated to the high level after the reset time has elapsed. The reset time according to the present embodiment is 200 μsec. The reset input circuit 154 supplies the reset signal RESETB to a reset control circuit 156 and the reset control circuit 156 generates a one-shot reset signal RES1 when the reset signal RESETB is inactivated to the high level. The one-shot reset signal RES1 is supplied to the refresh command generating circuit 143 or the clock control circuit 152.

Figure 2:
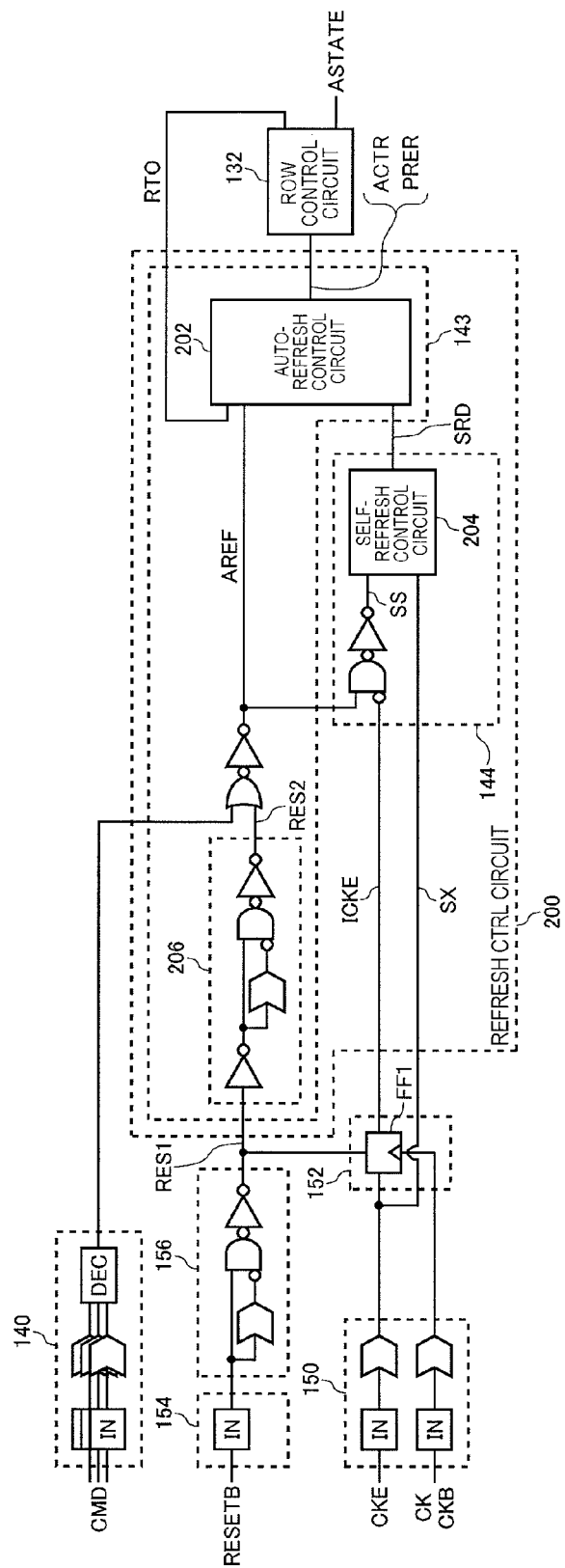
FIG. 2 is a circuit diagram of the refresh control circuit shown in FIG. 1.

Turning to FIG. 2, the refresh control circuit 200 includes the refresh command generating circuit 143 and the self-refresh command generating circuit 144. The refresh command generating circuit 143 includes a pulse generating circuit 206 and an auto-refresh control circuit 202. The auto-refresh control circuit 202 activates an ACTR signal in response to an AREF signal resulting from the reset signal RESETB. The row control circuit 132 refreshes the word lines WL in response to the ACTR signal. In other words, the ACTR signal is a refresh instruction signal for the row control circuit 132.

The self-refresh command generating circuit 144 includes a self-refresh control circuit 204. The self-refresh control circuit 204 enters a self-refresh mode due to an activation of an SS signal, and periodically activates a SRD signal. The auto-refresh control circuit 202 further activates the ACTR signal in response to the SRD signal. When an SX signal is activated, the self-refresh mode ends and the SRD signal stops.

The command input circuit 140 is supplied with various commands from the command terminal CMD. When the auto-refresh command REF is issued, a decoder DEC activates the AREF signal and causes the auto-refresh control circuit 202 to perform the auto-refresh.

The clock input circuit 150 is supplied with the clock enable signal CKE and the clock signals CK and CKB. When a predetermined time (which will be called "preparation time" below) has elapsed from the reset signal RESETB was inactivated from the low level to the high level, the clock enable signal CKE is activated from the low level to the high level. In other words, when the preparation time has elapsed after the reset state transited to the initial state, the clock signals CK and CKB are enabled to enable the initialization processing.

When the clock enable signal CKE enters high-active, a flip-flop FF1 included in the clock control circuit 152 is set. Thus, the SS signal will not be activated to the high level. In other words, the self-refresh control circuit 204 is not driven until an ICKE signal is driven to the low level again after the preparation time has elapsed.

When the reset signal RESETB is activated to the low level, it transits to the reset state. When the reset time has elapsed and the reset signal RESETB is inactivated to the high level, that is, when the operation state transits to the initial state, the reset control circuit 156 generates the one-shot reset signal RES1. The one-shot reset signal RES1 activates the AREF signal to the high level via the pulse generating circuit 206, and causes the auto-refresh control circuit 202 to perform the auto-refresh. The one-shot reset signal RES1 resets the flip-flop FF1. Thus, the ICKE signal as an output of the flip-flop FF1 enters the low level. Since the AREF signal is activated to the high level, when the ICKE signal enters the low level, the SS signal is activated to enter the self-refresh mode. There is a time lag until the SRD signal is actually activated after entering the self-refresh mode.

In summary, when the reset signal RESETB is inactivated to the high level, the auto-refresh is first performed once by the activation of the AREF signal, and the SRD signal is periodically activated based on the entry into the self-refresh mode, so that the self-refresh is performed multiple times.

After the preparation time has elapsed, the clock enable signal CKE is activated to the high level. At this time, the SX signal is activated and the self-refresh mode ends.

Figure 3:
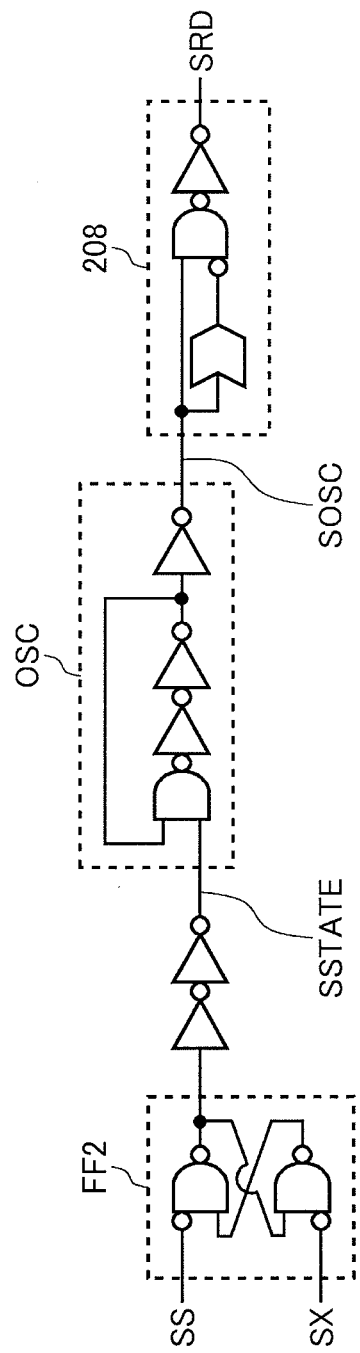
FIG. 3 is a circuit diagram of the self-refresh control circuit shown in FIG. 2.

Turning to FIG. 3, the self-refresh control circuit 204 includes a flip-flop FF2, an oscillator OSC and a pulse generating circuit 208.

Figure 4:
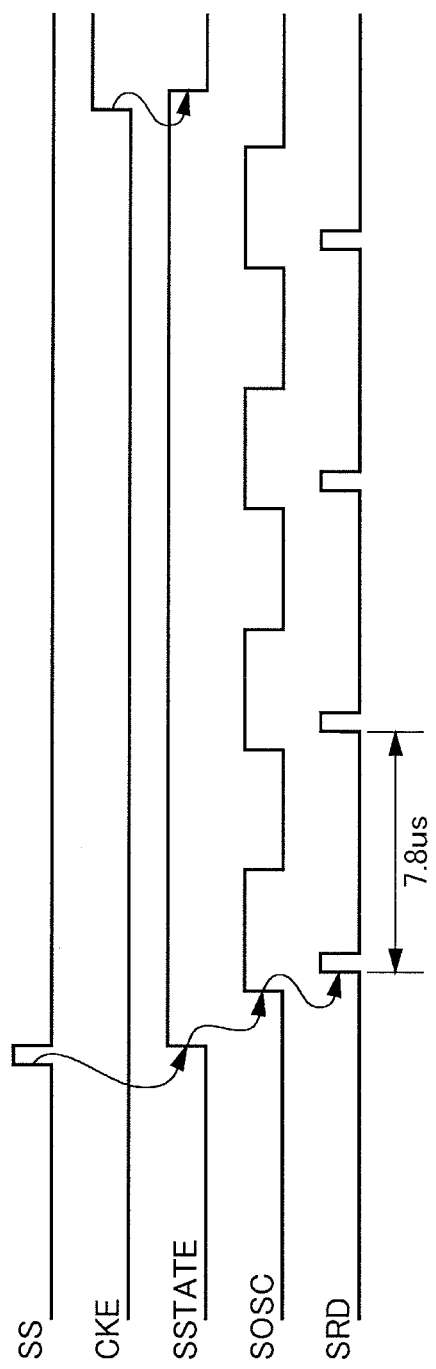
FIG. 4 is a time chart showing a processing process of the self-refresh control circuit.

Turning to FIG. 4, when the reset signal RESETB is activated to the low level and transits to the reset state, the clock enable signal CKE is temporarily fixed at the low level. After the reset time has elapsed, when the reset signal RESETB is inactivated to the high level and transits to the initial state, the SS signal of one-shot pulse is generated and the flip-flop FF2 is set. Thereby, the SS signal enters the self-refresh mode and an SSTATE signal as an output of the flip-flop FF2 enters the high level.

When the SSTATE signal enters the high level, the oscillator OSC is activated and a pulse-shaped SOSC signal is periodically output. In the present embodiment, the SOSC signal is activated every 7.8 μsec. The SSTATE signal is translated into the SRD signal of one-shot pulse by the pulse generating circuit 208. As described above, the SRD signal is supplied to the auto-refresh control circuit 202 so that the refresh is performed. In this way, when the SS signal is activated to enter the self-refresh mode, the SRD signal is periodically activated a little after the entry timing.

Figure 5:
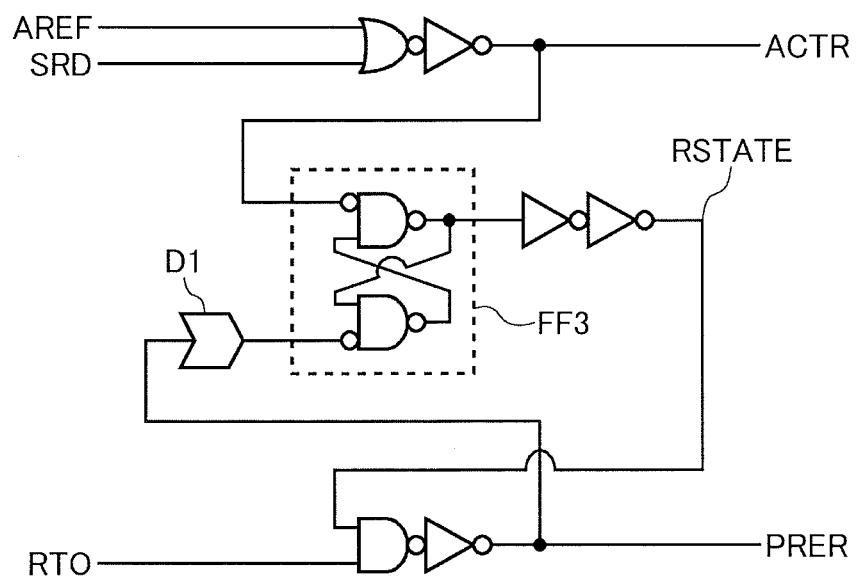
FIG. 5 is a circuit diagram of the auto-refresh control circuit shown in FIG. 2.

Turning to FIG. 5, the auto-refresh control circuit 202 includes a flip-flop FF3. The flip-flop FF3 is set when the AREF signal or the SRD signal is activated to the high level. At this time, the ACTR signal is activated to the high level to instruct the row control circuit 132 to perform the refresh. A RSTATE signal enters the high level.

When the row control circuit 132 performs the refresh operation, a RTO signal enters the high level. When the RTO signal also enters the high level in case the RSTATE signal is at the high level, the PRER signal is activated to the high level (which will be detailed later). Thereby, the PRER signal enters the high level. The RTO signal resets the flip-flop FF3 via a delay circuit D1, the RSTATE signal returns to the low level and the PRER signal also returns to the low level.

Figure 6:
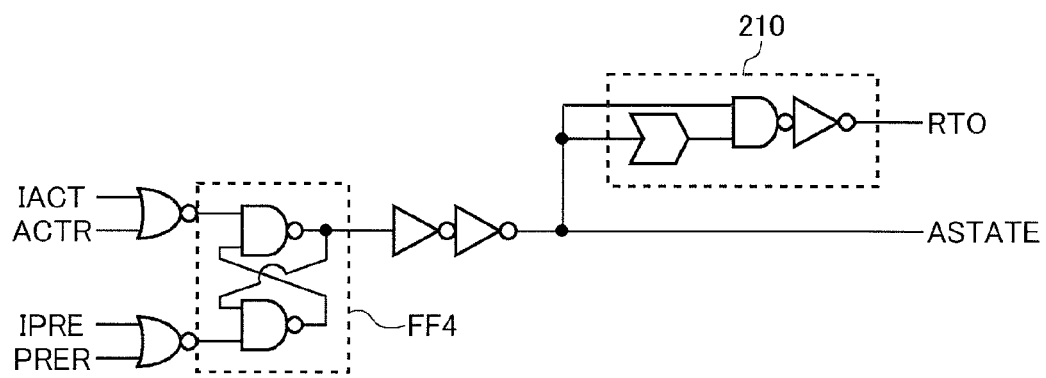
FIG. 6 is a circuit diagram of the row control circuit shown in FIG. 1.

Turning to FIG. 6, the row control circuit 132 includes a flip-flop FF4 and a rise edge delay circuit 210. The flip-flop FF4 is set by the active command IACT or the ACTR signal and is reset by a precharge command IPRE or an IPER signal. When the flip-flop FF4 is set, an ASTATE signal is activated and the refresh is performed in response to the ASTATE signal. The rise edge delay circuit 210 delays a rise edge of the ASTATE signal and generates the RTO signal.

Figure 7:
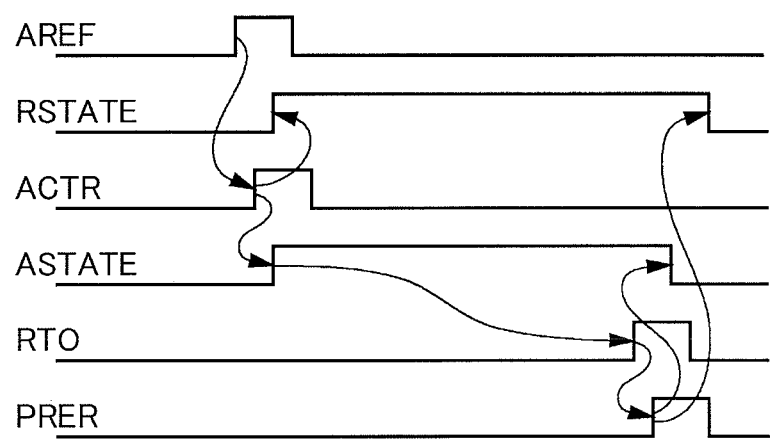
FIG. 7 is a time chart showing a processing process of the auto-refresh control circuit and the row control circuit.

Turning to FIG. 7, at first, when the AREF signal of one-shot pulse is activated, the flip-flop FF3 of the auto-refresh control circuit 202 is set and the ACTR signal is activated to the high level. The RSTATE signal is also activated to the high level.

The flip-flop FF4 of the row control circuit 132 is set by the ACTR signal, the ASTATE signal enters the high level and the refresh is performed. The rise edge delay circuit 210 delays the rise edge of the ASTATE signal to generate the RTO signal, the PRER signal is activated and after a while, the RSTATE signal returns to the low level by the reset of the flip-flop FF3. A fall edge of the RTO signal lags behind a fall edge of the ASTATE signal due to a signal delay by a NAND circuit and an inverter circuit inside the rise edge delay circuit 210. From the above sequence, each signal relating to the auto-refresh control circuit 202 and the row control circuit 132 returns to the low level (inactive state), that is, the original state.

Not the AREF signal but the SRD signal is activated during the self-refresh. Also in this case, the flip-flop FF3 is set and the ACTR signal is activated to the high level, and thus the basic sequence is the same. Thus, whenever the AREF signal as a signal of instructing to perform the auto-refresh or the SRD signal as a signal of instructing to perform the self-refresh is activated, the above sequence is performed to refresh the memory cell array 110.

Figure 8:
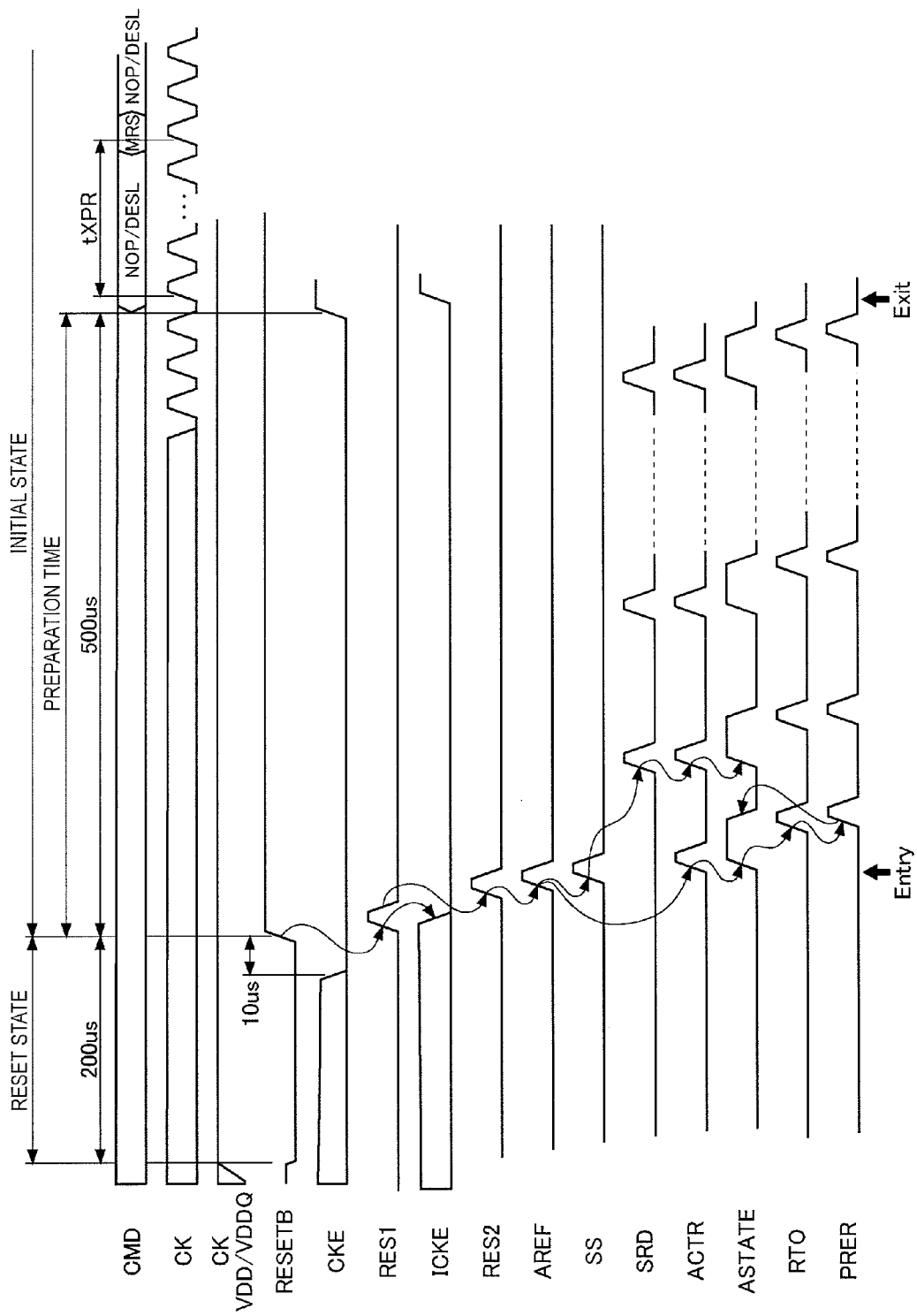
FIG. 8 is a time chart showing a processing process of the refresh at the initialization stage.

Turning to FIG. 8, at first, the reset signal RESETB is activated to the low level to transit to the reset state. The reset time is set at 200 μsec. The internal voltage is generated due to an increase or decrease in the external voltage in the reset state. After the reset time has elapsed, the reset signal RESETB enters the high level and transits from the reset state to the initial state. In the initial state, various initialization processings such as operational setting of the internal circuit according to various settings stored in fuse device or the like are performed.

However, when the internal voltage is higher than the specified value on transiting to the initial state, the normal initialization processing cannot be performed. In the present embodiment, the preparation time of 500 μsec is set during the transition to the initial state and the refresh processing is performed multiple times during the preparation time, so that an excess current is forcibly consumed to promote a decrease in the internal voltage. In FIG. 8, the process during the preparation time will be mainly described.

The reset signal RESETB is inactivated to the high level to transit to the initial state and the RES1 signal of one-shot pulse is activated. The flip-flop FF1 of the clock control circuit 152 is reset by the RES1 signal and the ICKE signal enters the low level. A RES2 signal of one-shot pulse is activated and the AREF signal is activated to the high level. On the other hand, the SS signal is also activated to enter the self-refresh mode. Even in the self-refresh mode, the self-refresh control circuit 204 does not generate the SRD signal immediately.

At first, the auto-refresh control circuit 202 activates the ACTR signal in response to the activation of the AREF signal. In the row control circuit 132, the flip-flop FF4 is set, the ASTATE signal enters the high level and the one-shot RTO signal is output. In this way, the first refresh is performed as the auto-refresh.

Since the SS signal is activated to enter the self-refresh mode, the SRD signal is periodically generated after a while. When the SRD signal is generated, the auto refresh control circuit 202 activates the ACTR signal, the ASTATE signal and the RTO signal. Thereby, the second refresh is performed as the self-refresh. Once entering the self-refresh mode, the self-refresh control circuit 204 periodically activates the SRD signal because the oscillator OSC oscillates. Consequently, the third and subsequent refresh is repeatedly performed as the self-refresh.

After the preparation time (500 μsec) has elapsed, the clock enable signal CKE is activated to the high level. The SX signal is activated to the high level due to the activation of the clock enable signal CKE. Consequently, the self-refresh mode ends and the SRD signal stops. In summary, the refresh is repeatedly performed in response to the inactivation of the reset signal RESETB, and the refresh ends in response to the activation of the clock enable signal CKE. Both the sequences for the reset signal RESETB and the clock enable signal CKE are almost same as well-known sequences in conventional DRAM.

Figure 9:
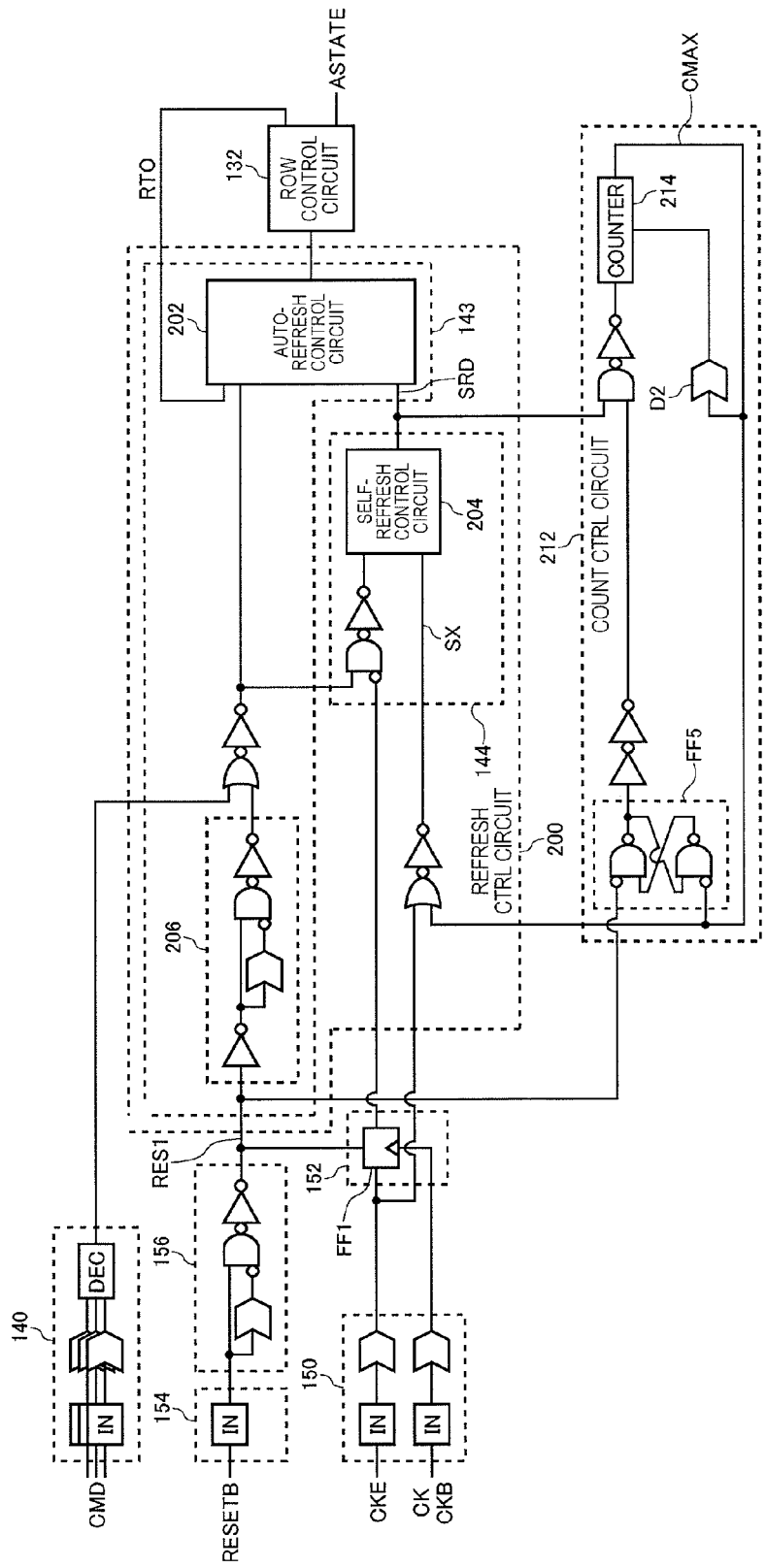
FIG. 9 is a circuit diagram of the refresh control circuit in the modification.

Turning to FIG. 9, the self-refresh control circuit 204 according to the modification ends the self-refresh mode not in response to the activation of the clock enable signal CKE but when the number of times of the refresh reaches a predetermined number of times (which will be called "a specified number of times" below). Therefore, a count control circuit 212 is added.

The count control circuit 212 includes a counter 214 and a flip-flop FF5. When the reset signal RESETB is inactivated to the high level, the RES1 signal of one-shot pulse is generated and the flip-flop FF5 is set. When the RES1 signal enters the self-refresh mode and the SRD signal is generated in this state, the counter 214 starts counting the number of times of generation of the SRD signal. Since the first refresh is performed as the auto-refresh, when the number of times of generation of the SRD signal reaches (the specified number of times—1), the counter 214 activates a CMAX signal as its output to the high level. In other words, when the number of times of the refresh performed during the preparation time reaches the specified number of times, the CMAX is activated to the high level. The SX signal is activated to the high level in response to the activation of the CMAX signal, and the self-refresh mode ends. The flip-flop FF5 is reset.

The CMAX signal is delayed by a delay circuit D2 and then resets the counter 214. Thereby, the counter 214 clears its holding count value. The CMAX signal returns to the low level.

The semiconductor device 100 has been described above according to the embodiment. When transiting from the reset state to the initial state, the semiconductor device 100 performs the refresh multiple times before actually starting the initialization processing. Thereby, an excess current can be efficiently consumed in a short time, thereby performing the initialization processing more safely. A specific circuit or specific device for promoting a decrease in the internal voltage is not substantially required. It can be easily achieved only by controlling the existing self-refresh control circuit 204 according to the existing reset signal RESETB or clock enable signal CKE.

What is claimed is:

1. A semiconductor device comprising:
   a memory cell array;
   an access control circuit configured to access the memory cell array; and
   a refresh control circuit configured to control the access control circuit so that the access control circuit is free from performing a refresh operation on the memory cell array when the semiconductor device is in a reset state, and so that the access control circuit performs the refresh operation on the memory cell array without receiving a refresh request from outside of the device when the semiconductor device transits from the reset state to an initial state.

2. The semiconductor device as claimed in claim 1, wherein
   the refresh control circuit is configured to produce a refresh signal a plurality of times, and
   the access control circuit is configured to perform the refresh operation in response to each occurrence of the refresh signal.

3. The semiconductor device as claimed in claim 2, wherein the refresh control circuit is configured to be free from producing the refresh signal when the semiconductor device is in the reset state, and produces a refresh signal after the semiconductor device transits from the reset state to the initial state.

4. The semiconductor device as claimed in claim 3, wherein the refresh control circuit is configured to stop producing the refresh signal in response to a first exit signal.

5. The semiconductor device as claimed in claim 4, wherein the first exit signal is a clock enable signal.

6. The semiconductor device as claimed in claim 3, further comprising a count control circuit configured to generate a second exit signal when the refresh control circuit produces the refresh signal a first number of times,
   wherein the refresh control circuit is configured to stop producing the refresh signal in response to the second exit signal.

7. The semiconductor device as claimed in claim 6, wherein the count control circuit is configured to initialize a count value of counting the refresh signal when the second exit signal is generated.

8. A device comprising:
   a memory cell array;
   a reset input circuit configured to produce a reset signal that takes one of first and second logic levels;
   a first control circuit configured to be free from issuing a refresh signal when the reset signal is in the first logic level and issue the refresh signal in response to a transition of the reset signal from the first logic level to the second logic level; and
   a second control circuit configured to perform a refresh operation on the memory cell array in response to the refresh signal.

9. The device as claimed in claim 8, wherein the first control circuit is configured to issue the refresh signal at least twice in response to the transition of the reset signal without receiving a refresh request from outside.

10. The device as claimed in claim 8, wherein the first control circuit is configured to stop issuing the refresh signal at a time when a clock enable signal is activated.

11. The device as claimed in claim 8, wherein
the first control circuit includes a first circuit unit configured to count up a count value thereof in response to the each issuance of the refresh signal and the first control circuit is configured to stop issuing the refresh signal when the count value of the first circuit unit reaches a first value.

12. A device comprising:
a memory cell array;
a control circuit configured to keep the memory cell array in a reset state during a first period of time, release the memory cell array from the reset state thereof to an initial state thereof and keep the memory cell array in the initial state during a second period of time following the first period of time, the control circuit being further configured to be free from performing a refresh operation on the memory cell array during the first period of time and perform the refresh operation on the memory cell array during the second period of time without receiving a refresh request from outside of the device.

13. The device as claimed in claim 12, wherein the control circuit is configured to release the memory cell array from the initial state thereof to an operable state thereof after the second period of time.

14. The device as claimed in claim 12, wherein the control circuit receives a reset signal that takes a first logic level during the first period of time and takes a second logic level during the second period of time, and the control circuit is configured to release the memory cell array from the reset state thereof to the initial state thereof in response to a transition of the reset signal from the first logic level to the second logic level.

15. The device as claimed in claim 8, wherein the first control circuit is configured to issue the refresh signal a plurality of times in response to the transition of the reset signal, and the second control circuit is configured to perform the refresh operation on the memory cell array in response to each issuance of the refresh signal.

* * * * *